(12) United States Patent
Nemati et al.

(10) Patent No.: US 6,690,039 B1
(45) Date of Patent: Feb. 10, 2004

(54) THYRISTOR-BASED DEVICE THAT INHIBITS UNDESIRABLE CONDUCTIVE CHANNEL FORMATION

(75) Inventors: Farid Nemati, Menlo Park, CA (US); Andrew Horch, Sunnyvale, CA (US); Scott Robins, San Jose, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/262,787

(22) Filed: Oct. 1, 2002

(51) Int. Cl.$^7$ ............................................. H01L 29/423
(52) U.S. Cl. ...................... 257/133; 257/138; 257/153
(58) Field of Search ................................. 257/133, 138, 257/147–155, 167, 903; 365/159, 180

(56) References Cited

U.S. PATENT DOCUMENTS

| | | | |
|---|---|---|---|
| 3,918,033 A | * 11/1975 | Case et al. .............. | 340/173 R |
| 4,462,151 A | 7/1984 | Geipel, Jr. et al. | |
| 4,555,842 A | 12/1985 | Levinstein et al. | |
| 4,677,455 A | * 6/1987 | Okajima ...................... | 357/38 |
| 4,870,028 A | * 9/1989 | Nishizawa et al. ............ | 437/6 |
| 5,179,038 A | 1/1993 | Kinney et al. | |
| 5,378,911 A | * 1/1995 | Murakami .................. | 257/334 |
| 5,770,490 A | 6/1998 | Frenette et al. | |
| 5,882,965 A | 3/1999 | Schwalke et al. | |
| 5,932,919 A | 8/1999 | Schwalke et al. | |
| 6,028,339 A | 2/2000 | Frenette et al. | |
| 6,104,045 A | 8/2000 | Forbes et al. | |
| 6,225,165 B1 | 5/2001 | Noble, Jr. et al. | |
| 6,229,161 B1 | 5/2001 | Nemati et al. | |
| 6,291,845 B1 | * 9/2001 | Blanchard ................... | 257/288 |

OTHER PUBLICATIONS

K. DeMeyer, S. Kubicek and H. van Meer, *Raised Source/Drains with Disposable Spacers for sub 100 nm CMOS technologies*, Extended Abstracts of International Workshop on Junction Technology 2001.

Mark Rodder and D. Yeakley, *Raised Source/Drain MOSFET with Dual Sidewall Spacers*, IEEE Electron Device Letters, vol. 12, No. 3, Mar. 1991.

Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9, Sep. 2001.

N. Lindert, Y.–K. Choi, L. Chang, E. Anderson, W.–C Lee, T.–J. King, J. Bokor, and C. Hu, *Quasi–Planar FinFETs with Selectively Grown Germanium Raised Source/Drain*, 2001 IEEE International SOI Conference, Oct. 2001.

(List continued on next page.)

*Primary Examiner*—Sara Crane

(57) ABSTRACT

A semiconductor device is adapted to inhibit the formation of a parasitic MOS-inversion channel between an emitter region and a gated base in a capacitively-coupled thyristor device. According to an example embodiment of the present invention, a thyristor having first and second base regions coupled between emitter regions is gated, via one of the base regions, to a control port. The control port exhibits a workfunction between the control port and the base region that inhibits the formation of a conductive channel between the base region and an adjacent emitter region, such as when the semiconductor device is in a standby and/or a read mode for memory implementations. The workfunction is selected such that the parasitic MOS-inversion channel would turn on is sufficiently high to enable the operation of the device at voltages that are optimized for a particular implementation while remaining below $V_T$. With this approach, the thyristor can be operated without necessarily turning "on" the parasitic MOS-inversion channel.

23 Claims, 4 Drawing Sheets

OTHER PUBLICATIONS

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide*, 1998 Symposium on VLSI Technology Digest of Technical Papers.

Hsiang–Jen Huang, Kun–Ming Chen, Tiao–Yuan Huang, Tien–Sheng Chao, Guo–Wei Huang, Chao–Hsin Chien, and Chun–Yen Chang, *Improved Low Temperature Characteristics of P–Channel MOSFETs with $Si_{1-x}Ge_x$ Raised Source and Drain*, IEEE Transactions on Electron Devices, vol. 48, No. 8, Aug. 2001.

Stanley Wolf Ph.D. and Richard N. Tauber Ph.D., *Silicon Processing for The VLSI Era*, vol. 1, 1986, pp. 285–286.

S.M. Sze, *Physics of Semiconductor Devices*, A Wiley–Interscience Publication, Second Edition, 1981, pp. 397 and 442.

Ponomarev, Y.V., Stolk, P.A., Salm, C., Schmitz, J., and Woerlee, P.H., *High–Performance Deep SiubMicron CMOS Technologies with Polycrystalline–SeGe Gates*, IEEE Transactions on Electron Devices, vol. 47, No. 4, pp. 848–855, Apr. 2000.

Ponomarev et al., *A 0.13 –μm Poly–SiGe Gate CMOS Technology for Low–Voltage Mixed–Signal Applications*, IEEE Transactions on Electron Devices, vol. 47, No. 7, pp. 1507–1513, Jul. 2000.

Ponomarev, Y.V., Schmitz, J., Woerlee, P.H., Stolk, P.A., and Gravesteijn, D.J., *Gate–Workfunction Engineering Using Poly–(Se,Ge) for High–Performance 0.18 μm CMOS Technology*, IEDM Tech. Dig., pp. 829–832, 1997.

* cited by examiner

THYRISTOR-BASED DEVICE THAT INHIBITS UNDESIRABLE CONDUCTIVE CHANNEL FORMATION

RELATED PATENT DOCUMENTS

This patent document is related to U.S. patent application Ser. No. 10/263,382 (TRAM.015PA), entitled "Thyristor-based Device Adapted to Inhibit Parasitic Current," filed on Oct. 1, 2002 and fully incorporated herein by reference.

FIELD OF THE INVENTION

The present invention is directed to semiconductor devices and, more specifically, to thyristor-based devices including thyristor-based memory devices.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the circuit design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price). DRAM cell size is typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

NDR devices including thyristors are widely used in power switching applications because the current densities carried by such devices can be very high in their on state. The performance of such NDR devices is dependent on many physical and operational parameters, including the interaction of a control port, such as a thyristor gate and the body of the thyristor. For example, it has been discovered that it is generally useful to control voltages to which the thyristor gate is exposed during various operating conditions of the NDR device in a manner that prevents an unwanted conductive channel from being formed in the body of the thyristor. Effectively, the formation of such a channel can result in a parasitic MOSFET being turned on within the thyristor. Controlling the voltages in this manner, however, is limiting in that the voltage for certain applications cannot be optimized where such an optimum voltage does not prevent the formation of the channel.

A thin capacitively-coupled thyristor-type NDR device can be effective in overcoming many previously unresolved problems in a variety of applications. An important consideration in the design of thin capacitively-coupled thyristor devices involves designing the body of the thyristor sufficiently thin, so that the capacitive coupling between a control port and a base region of the device can substantially modulate the potential of the base region. Another important consideration in the design of thin capacitively-coupled thyristors involves preventing the formation of an unwanted conductive channel within the thyristor, as discussed above.

These and other design considerations have presented challenges to the implementation of such thyristors in a variety of circuit applications.

SUMMARY

The present invention is directed to a semiconductor device, including those specific examples discussed and incorporated above, that addresses the above-mentioned challenges. The present invention is exemplified in a number of implementations and applications, some of which are summarized below.

According to an example embodiment of the present invention, a semiconductor device includes a thyristor having a control port (e.g., gate electrode) that switches a thyristor between a blocking state and a conducting state while inhibiting parasitic MOS-inversion channel formation. The thyristor includes a plurality of thyristor regions including a first base region adjacent to a first emitter region and a second base region adjacent to a second emitter region, with the first and second base regions being electrically coupled to one another. The control port exhibits a workfunction such that the control port is arranged to capacitively couple a signal to at least one of the plurality of thyristor regions in a manner that controls current in the thyristor while inhibiting the formation of the parasitic MOS-inversion channel. With this approach, it has been discovered that the operation of the semiconductor device can be optimized without necessarily increasing the distance between the thyristor gate and a junction between the base and emitter regions, and while inhibiting the tendency of a parasitic MOS-inversion channel from being turned "on." When used in memory applications, voltages applied to the thyristor control port during standby, write and read modes can be selected with a wider range of applicable values without necessarily forming a parasitic MOS-inversion channel.

According to a more particular example embodiment of the present invention, a memory cell includes a thyristor having a gate adapted to switch the thyristor between a blocking state and a conducting state while preventing the formation of an unwanted conductive (inversion) channel in the device. The cell also includes a pass device, such as a MOSFET, having first and second source/drain regions separated by a channel region and a pass gate capacitively coupled to the channel region via a gate dielectric. The pass gate switches the channel region between a blocking state and a conducting state in response to a voltage being applied thereto, and the channel is adapted to electrically couple the first and second source/drain regions when in the conducting state. A bit line is coupled to the first source/drain region and a first word line is coupled to the pass gate. The thyristor has a work function that is different than and defined independent of the work function of the MOS-based pass device.

The thyristor includes a first base region adjacent to a first emitter region and a second base region adjacent to a second emitter region, with the first and second base regions being coupled to one another (e.g., in a PNPN orientation). The first emitter region is connected to the second source/drain region of the pass device. A second word line is coupled to the thyristor gate and is adapted to apply a voltage, such as a standby, read or write voltage, to the control port. In response to the voltage applied by the second word line, the thyristor gate capacitively couples a signal to the first base region that switches the thyristor between blocking and conducting states. The thyristor gate has a workfunction that is adapted to inhibit parasitic MOS-inversion channel formation in the thyristor between the first emitter region and the first base region. In one instance the thyristor gate is arranged to exhibit a workfunction in connection with the first base region such that the threshold voltage that must be applied to the second word line in order to form the parasitic MOS-inversion channel is higher than the actual operating voltage applied to the second word line for selected operation of the memory cell.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, each of which illustrated one or more example implementations of the present invention and in which.

Figure 1:
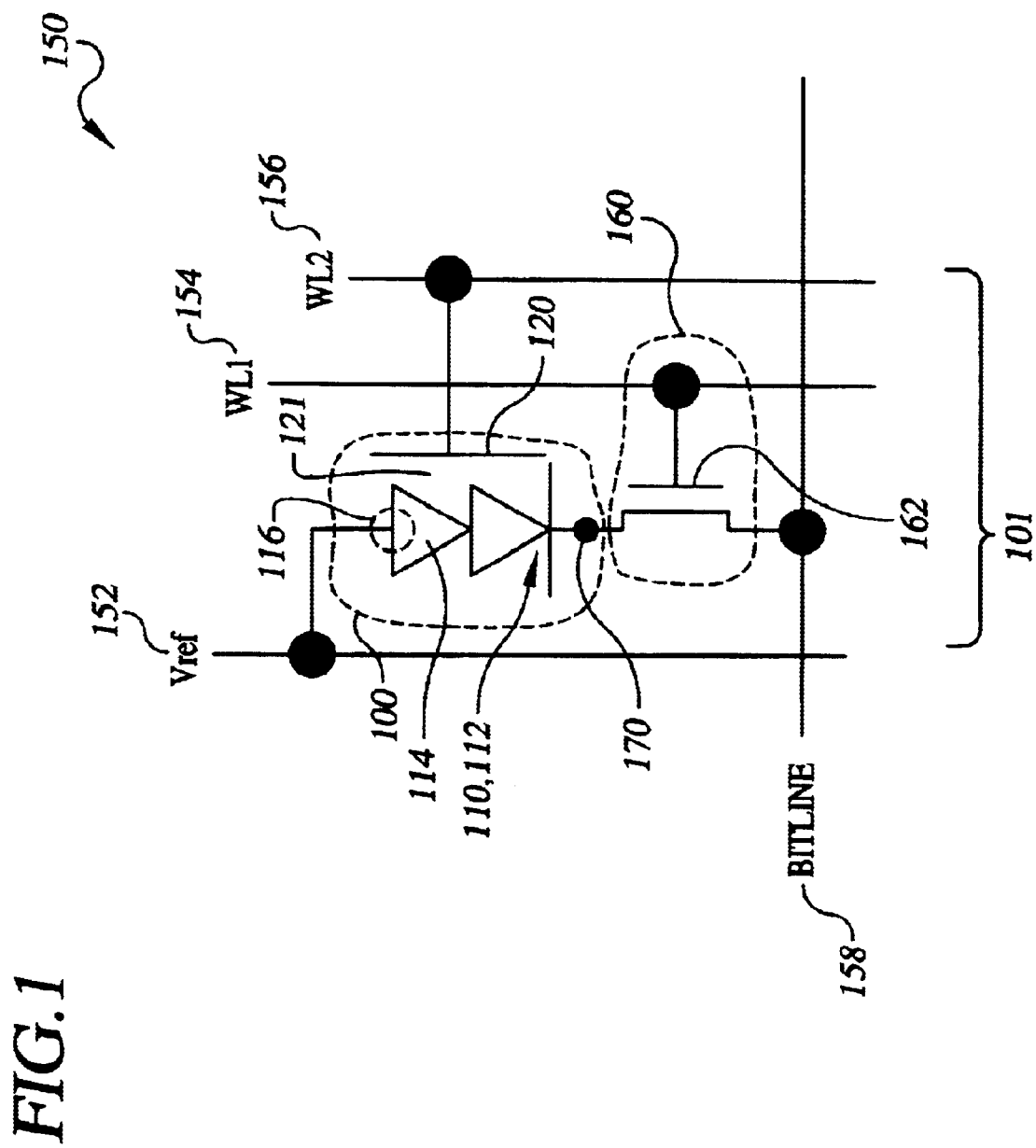
FIG. 1 is schematic used to show two particular example implementations, the first being a thyristor-based circuit and the second being this thyristor-based circuit in a particular type of memory cell.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of thyristor-based devices, and has been found to be particularly useful for such devices having a capacitively-coupled control port and benefiting from the ability to inhibit the formation of a parasitic MOS-inversion channel between an emitter region and an adjacent base region of the device. Example applications of such devices include fast-acting switches such as memory cells and power thyristors. While the present invention is not necessarily limited to such devices and applications, various aspects of the invention may be appreciated through a discussion of various examples using this context.

According to an example embodiment of the present invention, a semiconductor device includes a thyristor having a capacitively-coupled gate electrode (or control port) arranged to facilitate control current flow in the thyristor by selectively coupling at least one voltage pulse to a first base region of the thyristor. This selective coupling, with appropriate bias at the near and far thyristor end regions, causes the thyristor to switch between blocking and conducting states. In many implementations of the present invention, the adjacent thyristor body regions (e.g., typically doped PNPN, respectively) are implemented with a relatively thin cross section so the selective coupling at the capacitively-coupled control port can influence tight control on the potential of the underlying P-base body region. Many applications require that such a thin capacitively-coupled thryristor device be operated over a relatively small range of voltages and with minimal risk of channel inversion at the surface of the body region immediately adjacent the capacitively-coupled control port. According to various embodiments of the present invention, these ideals are achieved by designing into the thyristor device an overall work function and/or gate work function that both inhibits this parasitic MOS-inversion channel formation without particular regard to the "on-performance" (current conducting) characteristics of the MOS-appearing structure.

In a more particular example embodiment of the present invention, the gate work function is specifically optimized (to inhibit any such parasitic MOS-inversion channel formation) relative to the gate work function of an access transistor used to appropriately bias the far-end thyristor region and, as with the above-discussed embodiment, without particular regard to these MOS-related on-performance characteristics.

The above approaches are particularly useful in applications where the first base region separates an adjacent emitter region from a second base region (e.g., a PNP or NPN structure), where the thyristor is susceptible to the formation of such a parasitic MOS-inversion channel in the first base region. In this instance, voltage levels that the thyristor gate electrode is exposed to may, for example, undesirably bias a portion of the first base region near the thyristor gate electrode, creating the MOS-inversion channel. When such a parasitic MOS-inversion channel forms, current leakage via the MOS-inversion channel can undesirably alter data stored at the emitter region. By selecting the thyristor gate electrode workfunction as a function of voltage levels to which the thyristor gate electrode is exposed, thyristor-based semiconductor implementations can be tailored to operate in selected voltage ranges without necessarily reaching a threshold voltage required to turn on a parasitic MOS-inversion channel. For instance, in thyristor-based memory cells, voltages to which the thyristor gate electrode is typically exposed during operation including standby, read and/or write operations can be applied without concern of undesirable formation of a MOS-inversion channel. For more information regarding thyristor-based devices in general, and for specific implementations to which the present invention is applicable, including the controlling current flow in a thyristor via a capacitively-coupled control port, reference may be made to U.S. Pat. No. 6,229,161 (Nemati, et al.), which is fully incorporated herein by reference.

FIG. 1 shows two particular example circuit implementations according to the present invention. As a subset of the overall circuit illustrated in FIG. 1, the first example circuit implementation is depicted in dashed lines as a thyristor device 100 and a MOS switch (or pass device) 160. The second example circuit implementation is depicted as the overall circuit 150 exemplifying a particular use of the first example circuit implementation within a memory cell. Consistent with the above discussion, a power thyristor is another particular example use of the first example circuit implementation.

Using a typical semiconductor manufacturing process, the thyristor-based circuit, items 100 and 160, is formed with the thyristor body regions formed below substrate-surface level and with the thyristor control port and the MOS gate, respectively, formed above substrate-surface level. With the desired doping for the thyristor body regions and the MOS source/drain, dielectric and gate layers are formed and subsequently etched to complete the respective structures for the thyristor device 100 and MOS switch 160. In addition to the MOS switch 160 having an inherent MOS-inversion channel formation due to its intended operation, in view of the control port over the oppositely-doped thyristor body regions, the thyristor device 100 would be susceptible to parasitic MOS-inversion channel formation. This inversion potential would especially be true in designs where the operating range and the relevant (gate) work functions for each of the structures 100 and 160 are relatively the same.

The example thyristor control port 120 of FIG. 1 is used to capacitively couple voltage pulses to the adjacent thyristor region(s), with the capacitive coupling to the first base region being the primary (e.g., greater than 50%) capacitive coupling. This control port 120 is adapted to exhibit a workfunction that inhibits the formation of a parasitic MOS-inversion channel, such as a parasitic MOSFET, during selected operation of the device 100. The MOS inversion potential for the thyristor device 100 is mitigated by designing the thyristor's parasitic work function different than and independent of the work function of the MOS-based pass device. For example, in one instance, the control port exhibits a workfunction that raises a threshold voltage required to turn on the parasitic MOS-inversion channel to a level higher than operating voltages applied to the control port (e.g., higher than standby and/or read voltages applied to the control port). In addition, the workfunction is such that the MOS-inversion channel is inhibited while the standby and read voltages vary, for example, in order to optimize the standby and/or read voltages for the application in which the thyristor is being used.

In another particular implementation, the control port 120 is selectively doped to either n type or p type to achieve a desired voltage threshold ($V_T$) of the MOS-inversion channel. In another implementation, the $V_T$ of the MOS-inversion channel (associated with the control port 120) is made as large as possible to prevent an inversion channel from forming. In one instance, the $V_T$ is increased by changing the workfunction difference between the control port (e.g., gate) material and the channel region. The relationship between $V_T$ and workfunction difference ($\phi_{ms}$) is given be the following equations:

$$V_T = \phi_{ms} - (Q_f/C_i) + 2\psi_B + (4\epsilon_s q N_A \psi_B)^{1/2}/C_i;$$

where $$\phi_{ms} = \phi_m - (\chi + E_g/2q + \psi_s);$$

$\phi_m$ is the gate workfunction;

$(\chi + E_g/2q + \psi_s)$ is the channel region workfunction;

$\chi$ is the electron affinity of the substrate;

$E_g$ is the energy band gap;

q is the magnitude of electric charge;

$\psi_s$ is the electrostatic potential of the surface;

$Q_f$ is the fixed surface charge;

$C_i$ is the capacitance per unit area;

$\psi_B$ is the potential difference between the Fermi level and the intrinsic Fermi level;

$\epsilon_s$ is the permittivity of the silicon; and $N_A$ is the substrate doping.

The channel region workfunction is independent of the gate (control port 120) workfunction. In one implementation, the control port 120 is doped using a separate implant step and in another implementation, the control port is doped during an implant step for other portions of the semiconductor device. For general information regarding thyristor implementations, and for specific information regarding the prevention of the formation of a parasitic MOSFET for which the present invention is applicable, reference may be made to the above-referenced U.S. Patent document (TRAM.015PA), discussed above. Additionally relevant to various applications of the present invention, for general information regarding the "$V_T$" and other aspects of semiconductor devices to which the present invention is applicable, and for specific information regarding the selection and manipulation of gate workfunction properties (e.g., mole fraction, electron affinity and band gap), reference may be made to "Physics of Semiconductor Devices 2nd Edition" by S. M. Sze, A Wiley-Interscience Publication, 1981, page 442 and to the following articles: Ponomarev, et al., "High-Performance Deep SubMicron CMOS Technologies with Polycrystalline-SeGe Gates," IEEE Transactions on electron Devices, Vol. 47, No. 4, April 2000; Ponomarev et al., "A 0.13 µm Poly-SiGe Gate CMOS Technology for Low-Voltage Mixed-Signal Applications," IEEE Transactions on Electron Devices, Vol. 47, No. 7, July 2000; and Ponomarev et al., "Gate-Workfunction Engineering Using Poly-(Se,Ge) for High-Performance 0.18 µm CMOS Technology," IEDM Tech. Dig., 1997, pp. 829–832, all of which are fully incorporated herein by reference.

Referring now to the second example circuit implementation, which is depicted as the overall circuit 150 of FIG. 1, the first example circuit implementation is shown within a thyristor-based memory cell 101 in a memory arrangement 150, also consistent with example embodiments of the present invention. The memory cell 101 includes a data (logical "zero" or "one") storage node 170 which is accessed via the MOS switch (pass device) 160. The MOS gate 162 is coupled to a first word line (WL1) 154. The thyristor control port 120 is coupled to a second word line (WL2) 156, and the thyristor emitter region 116 is coupled to Vref 152. The memory arrangement 150 is adapted to access and manipulate data at the storage node 170, which may, for example, include one or both of the thyristor emitter region 110 and a source/drain region of the MOS switch 160. The data access and manipulation may include, for example, conventional "write" and "read" operations.

The workfunction of the thyristor control port 120 can be adapted to meet the needs of a variety of applications. For example, in one implementation, the thyristor control port 120 exhibits a workfunction chosen so that the $V_T$ at which the MOS-inversion channel between the emitter and adjacent base region (e.g., for a parasitic MOSFET to be turned "on") is increased as much as possible. By increasing the $V_T$, the voltage at the gate during write, standby and read modes can vary higher without necessarily forming the channel between the base and emitter region. Using this workfunction and the corresponding higher $V_T$, the thyristor operation can be optimized independently from that would exist for control port operation, due to the need to prevent the parasitic MOSFET from being turned "on."

Where the thyristor-based memory cell includes a thin capacitively-coupled thyristor with a gate capacitively coupled to a P base region, the gate can be brought from a low voltage to about the $V_T$ of the parasitic MOS-inversion channel. Referring again to FIG. 1, in a more particular example embodiment, the thyristor is formed with base region 112 being a P base, emitter region 110 being an N+ emitter, base region 114 being an N base and emitter region 116 being a P+ emitter. The parasitic MOS-inversion channel is effectively formed from the N+ emitter 110 to the gated P base 112 to the N base 114. In this implementation, the gate 120 is adapted to exhibit a workfunction that results in the $V_T$ of the parasitic MOS-inversion channel being about 1V (volt). The voltage swing required on the gate to switch the thyristor between a blocking state and a conducting state can then be increased so that the high end of the swing is about 1V. For instance, a typical voltage swing for a thin capacitively-coupled thyristor may be about 3V, such that the $V_T$ being 1V allows the voltage swing to be between about −2V to 1V. The higher voltage swing is advantageous because it is easier to generate on a chip, relative to a lower swing (e.g., −2.5V to 0.5V), and may reduce stress on the gate dielectric 121.

In another implementation, the gate workfunction is effected using a polysilicon gate doped with Germanium (Ge) and/or Boron and/or Phosphorous to achieve a workfunction of between about 4.2 eV (e.g., for a Phosphorous-doped gate) to about 5.3 eV (e.g., for a Boron doped gate). For general information regarding gate workfunction and for specific information regarding the selection and manipulation of gate workfunctions that may be implemented in connection with the present invention, reference may be made to "Physics of Semiconductor Devices $2^{nd}$ Edition" S. M. Sze, A Wiley-Interscience Publication, 1981, p.397, which is fully incorporated herein by reference. This approach is particularly useful for memory applications where the standby and/or read voltage is between about −1V and about −3V. In a more particular implementation, the doping of the polysilicon gate with Germanium is effected such that the mole fraction is about 0.6.

In another example embodiment of the present invention, the control port 120 is doped to the same polarity as the base region 112 to which it capacitively couples. For instance, where the base region 112 is P− doped, the control port is P+ doped, which increases the $V_T$ of any parasitic MOSFET that may form. Similarly, when the base region 112 is N− doped (e.g., where the N− doped and P− doped regions of the thyristor are interchanged), the control port 120 is doped with an N+ dopant, with similar increases in $V_T$ of the parasitic MOSFET.

In another example embodiment of the present invention, the control port 120 includes at least two materials that are selected to achieve a desired workfunction that allows thyristor operation while inhibiting the formation of a MOS inversion channel. In one implementation, the control port 120 includes metal such as Aluminum, tantalum, molybdenum and/or cobalt, which increases the $V_T$ of a parasitic MOSFET. In another implementation, the control port 120 includes an alloy such as a Titanium/Tungsten or a metal/semiconductor combination, such as Silicon/Tungsten.

Figure 2:
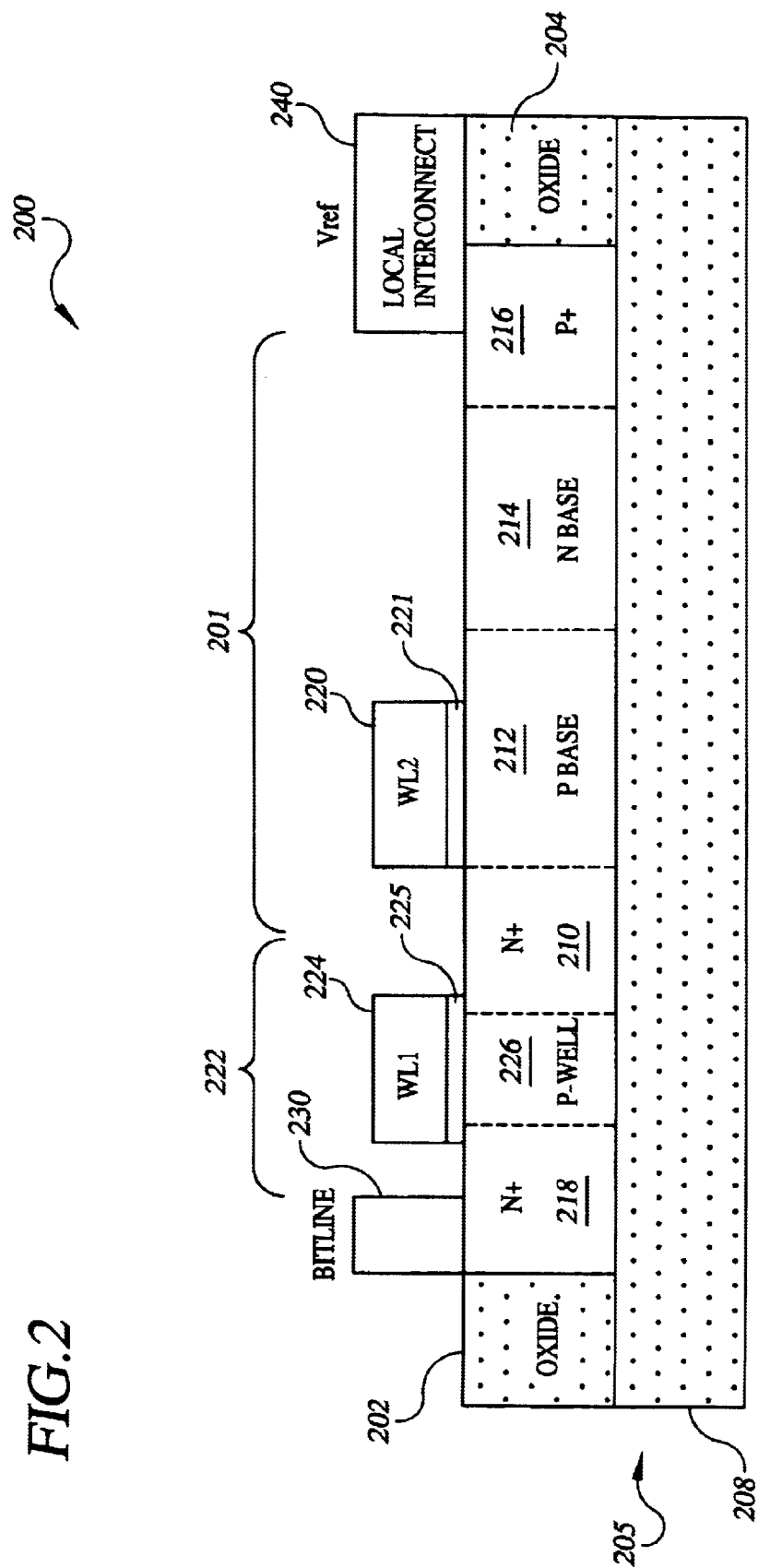
FIG. 2 is a thyristor-based memory cell formed over an insulator portion of silicon on insulator (SOI) structure.

FIG. 2 shows a thyristor-based memory cell 200 having a thyristor 201 over an insulator portion 208 of silicon on insulator (SOI) structure in a substrate 205, according to a more particular example embodiment of the present invention. The thyristor 201 includes N+ emitter region 210, P base region 212, N base region 214 and P+ emitter region 216. The thyristor regions may be formed in a variety of manners, such as using polysilicon doped to achieve the respective polarity/dopant type. The P+ emitter 216 and the N base 214 form an anode end portion of the thyristor 201, and the N+ emitter 210 and the P base region 212 form a cathode end portion of the thyristor 201. A thyristor gate 220 (e.g., a polysilicon gate) is arranged to capacitively couple a signal to the P base region 212 via dielectric material 221 (e.g., oxide). A pass device 222 includes source/drain regions 218 and 210 separated by a P-well region 226 over which a gate dielectric 225 and a gate 224 are formed. The source/drain region 210 is also an emitter for the thyristor, and the gate 224 is arranged to capacitively couple to the P-well region 226 via the dielectric material 225 for controlling current flow between the source/drain regions 218 and 210. The source/drain region 218 is coupled to a bit line 230, and the P+ emitter region 216 is coupled to a local interconnect 240 that is adapted to carry a reference voltage (Vref). The pass device and the thyristor are built over an insulator portion 208 of the SOI structure and are insulated from other circuitry in the device by oxide isolation regions 202 and 204.

Gate 224 is part of a first word line (WL1) and gate 220 is part of a second word line (WL2). In response to a signal (e.g., a voltage) at WL2, gate 220 is adapted to capacitively couple to the base region 212 for switching the thyristor 201 between a blocking state and a conducting state. The gate 220 is further adapted to exhibit a workfunction such that, when in the standby or read mode, the formation of a MOS-inversion channel between the P base 212 and the N+ emitter 210 is inhibited, as discussed above. When in the conducting state, a conducting channel formed between the thyristor emitter regions 210 and 216 may be used, for example, for performing read and/or write functions from and to emitter region 210, used here as a storage node.

Figure 3:
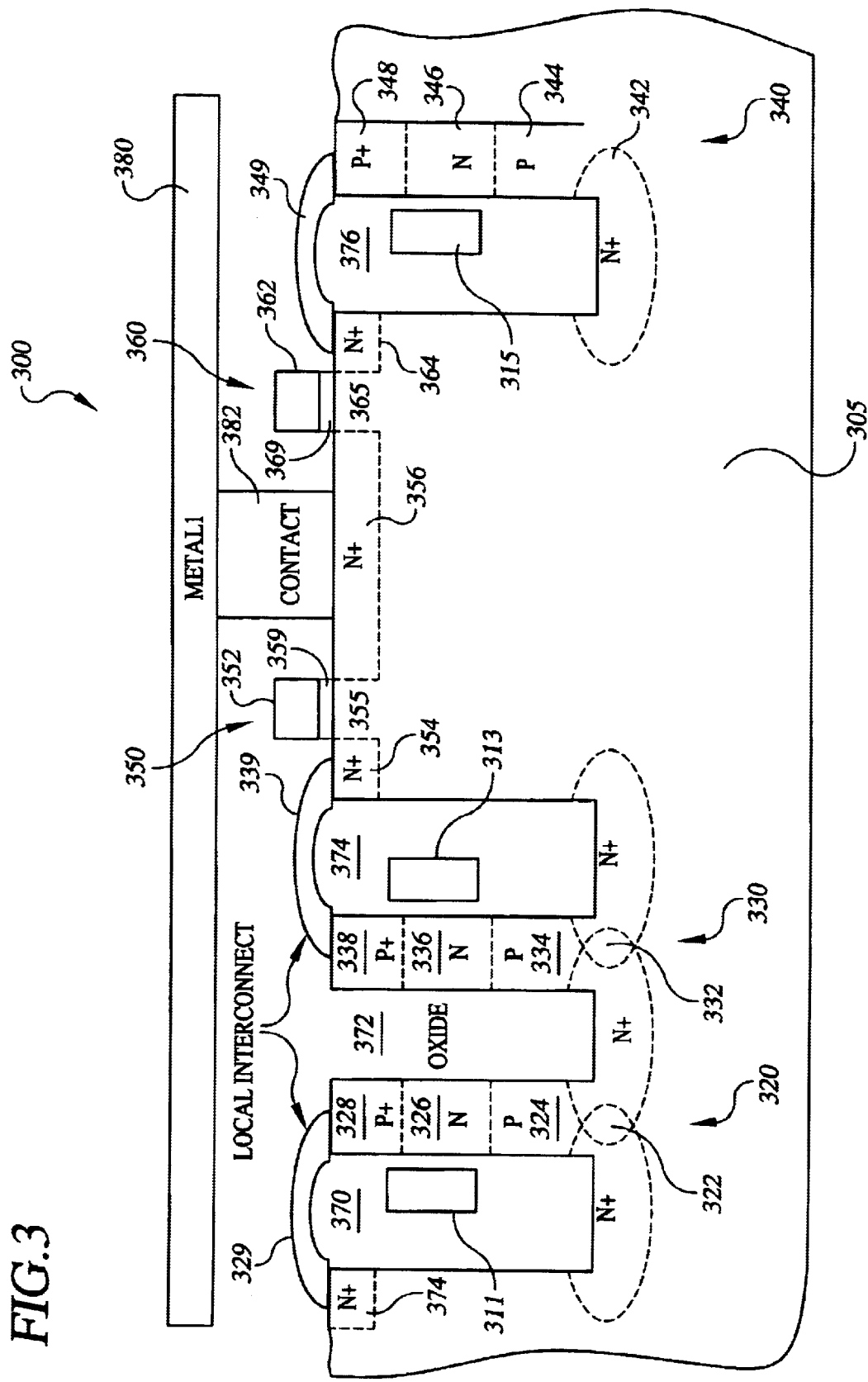
FIG. 3 shows thyristor-based memory cells formed vertically in a substrate.

FIG. 3 shows a thyristor-based memory cell 300, according to another example embodiment of the present invention. Three thyristors 320, 330 and 340 are shown, each having similarly numbered regions (e.g., P base portion 334 corresponds to P base portions 324 and 344). In this regard, thyristor 330 and related portions of the device 300 will be described in detail, with the intent that the description may also be applied to thyristors 320 and 340 and the portions of the device related thereto. The thyristors are formed vertically in bulk substrate 305 of the device and are electrically insulated from other portions of the device by oxide trench regions 370, 372, 374 and 376. The thyristor 330 includes an emitter region 332, shown having two N+ doped regions below the oxide trenches 372 and 374. A P base region 334 is adjacent to the emitter 332 and an N base region 336, which is also adjacent to an emitter 338. The N+ emitter region 332 and P base region 334 make up a cathode end portion of the thyristor, and the P+ emitter region 338 and the N base region 336 make up an anode end portion of the thyristor.

The thyristors are electrically coupled to a reference voltage (Vref) and in series with pass devices, and each base region is coupled to a control port. Referring again to the thyristor 330, a thyristor control port 313 is coupled to N base region 336 and is adapted to provide the base region with a signal causes the thyristor device to switch between a blocking state and a conducting state. The control port 313 is adapted to exhibit a workfunction that inhibits the formation of a parasitic channel between the base region 336 and adjacent P+ emitter region 338, such as when the control port is at a standby and/or read voltage, in a manner similar to that discussed above. The N+ cathode emitter 332 is coupled to Vref (not shown), and the P+ anode emitter 338 is coupled in series with a pass device 350.

A pass device 350 includes source/drain regions 354 and 356 having an N+ doping, and a gate 352 that is capacitively coupled to a channel region 355 via a gate dielectric 359. The source/drain region 354 is coupled to the P+ emitter 338 via a local interconnect 339. The source/drain region 356 is coupled via a contact 382 to an interconnect 380 (e.g., Metal 1). In one implementation, the gate 352 is part of a first word line (WL1), control port 313 is part of a second word line (WL2) and the Metal 1 interconnect 380 is part of a bit line, and the device 300 is used in connection with memory storage.

Figure 4:
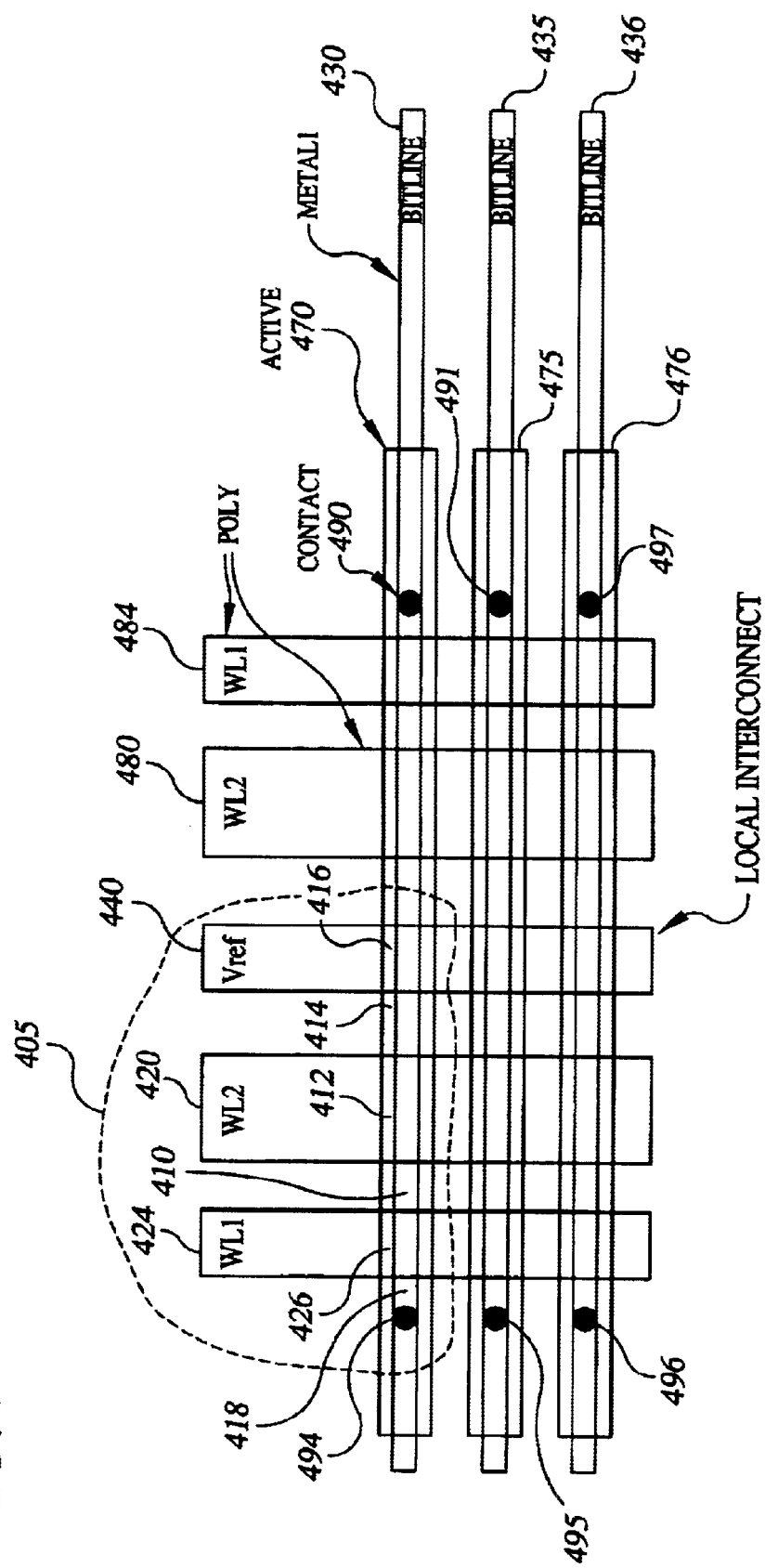
FIG. 4 is memory array.

FIG. 4 is a memory array 400 having thyristor-based devices, with six memory cells shown for brevity, according to another example embodiment of the present invention. The memory array 400 includes active regions 470, 475 and 476 that include various base, emitter, well and source/drain regions (e.g., such as those shown in FIG. 2). First word lines (WL1) 424 and 484 are arranged to capacitively couple to well regions for pass devices, and second word lines (WL2) 420 and 480 are arranged to capacitively couple to first thyristor base regions. Bit lines 430, 435 and 436 are coupled to source/drain regions of pass devices in the active regions via contacts 490, 491, 494, 495, 496 and 497. Local interconnect 440 is adapted to supply a reference voltage (Vref) to emitter regions in the active regions.

Referring specifically to a memory cell region 405 in the array, a first pass device includes source/drain regions 418 and 410, with a control gate 424 (WL1) capacitively coupled to a well region 426 (below WL1) and adapted to turn on the pass device in response to a voltage being applied thereto. The source/drain region 410 also is a first emitter region of a thyristor body, which also includes a first base region 412 (below WL2), a second base region 414 and a second emitter region 416. Bit line contact 494 is coupled to the source/drain region 418, and a reference voltage is coupled to the second emitter region 416 via local interconnect 440. The memory cell region 405 may, for example, include the thyristor-based device shown in FIG. 2, with corresponding regions being similarly numbered (e.g., source/drain/N+ emitter region 210 in FIG. 2 corresponds to region 410 in FIG. 4). The emitter region 210 is arranged for storing data therein, with read and write access to the emitter region 210 being controlled via WL1 and WL2. Each cell in the array has a storage node, such as the shared source/drain/emitter region 210.

As an alternative approach, any of the above embodiments can be modified using the approach(es) illustrated and described in concurrently-filed U.S. Provisional Patent Application Ser. No. 60/415,356, entitled "Novel Minority Carrier Isolation Device," filed on Oct. 1, 2002.

The various embodiments described above are provided by way of illustration only and should not be construed to limit the invention. As discussed above, the present invention is applicable to a variety of thyristor-based devices, and these devices may include applications such as memory cells, memory arrays and power switching devices. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and pass devices; adding structures to the integrated circuit device; increasing the number of PN body sections in the thyristor; interchanging dopant types in the control ports and interchanging P and N regions and/or interchanging PMOS-FETS with NMOSFETS. In addition, for general information regarding thyristors including thin capacitively-coupled thyristors, and for particular information regarding implementations to which the present invention is applicable and their respective operations, reference may be made to U.S. Pat. No. 6,229,161. Such modifications and changes do not depart from the true spirit and scope of the present invention that is set forth in the following claims.

What is claimed is:

1. A semiconductor device, comprising:
   a thyristor including a set of adjacent body regions and a control port capacitively-coupled to and facing at least one of the set of adjacent body regions, the set of adjacent body regions including regions of opposite polarity and end regions and the control port adapted to receive voltage pulses for facilitating current control in the set of adjacent body regions;
   a pass device adapted to provide a bias voltage to one of the end regions of the thyristor; and
   each of the control port and the pass device having respective work functions that are different from each other, the work function of the pass device defined as a function of a current-conducting state for the pass device and the work function of the control port defined to inhibit formation of a parasitic MOS-inversion channel in said at least one of a set of adjacent body regions in response to a voltage pulse at the control port of the thyristor.

2. The semiconductor device of claim 1, wherein the workfunction of the thyristor control port is sufficient to control current flow in the thyristor during read, standby and write operations of the thyristor, while not forming a MOS-inversion channel in the thyristor under voltages exposed to the thyristor control port during the read, standby and write operations.

3. The semiconductor device of claim 1, further comprising a signal driver configured and arranged to present a control signal to the thyristor control port, the workfunction of the thyristor control port being configured and arranged to inhibits the parasitic MOS-inversion channel formation when the signal driver is applying the control signal to the thyristor control port.

4. The semiconductor device of claim 2, wherein the thyristor comprises a first base region, a second base region and a first emitter region, control port is arranged to capacitively couple to the first thyristor base region, wherein the first emitter region is a memory cell storage node and wherein the thyristor control port workfunction is configured and arranged such that a threshold voltage for forming the MOS-inversion channel between the first emitter region and the second base region exceeds a threshold voltage required to control current flow in the thyristor.

5. The semiconductor device of claim 4, wherein the control port workfunction is adapted to exhibit a threshold voltage of about 1 V (volt) for forming the parasitic MOS-inversion channel and wherein the control port is configured and arranged to switch the thyristor between a blocking state and a conducting state at a voltage swing of between about −1V and about 1V.

6. The semiconductor device of claim 1, wherein the thyristor control port includes a dopant species that is selected to achieve the workfunction that inhibits the MOS-inversion channel formation in the thyristor.

7. The semiconductor device of claim 1, wherein the thyristor control port is configured and arranged to exhibit a mole fraction of materials that is selected to achieve the workfunction that inhibits the parasitic MOS-inversion channel formation in the thyristor.

8. The semiconductor device of claim 1, wherein the workfunction of the control port is further configured and arranged to inhibit parasitic MOS-inversion channel formation in the thyristor body regions when the thyristor control port is controlled to maintain the thyristor in a current blocking state.

9. The semiconductor device of claim 1, wherein the thyristor control port includes metallic material.

10. The semiconductor device of claim 1, wherein the thyristor control port is doped to a polarity that is the same as said at least one of the plurality of thyristor body regions to which the control port is configured and arranged to capacitively couple to for switching the thyristor.

11. The semiconductor device of claim 10, wherein the thyristor control port is configured and arranged to primarily capacitively couple to a first base region of the thyristor for controlling current flow in the thyristor body regions and wherein the thyristor control port is doped to the same polarity as the first base region.

12. The semiconductor device of claim 1, wherein the thyristor control port is configured and arranged for controlling current flow in the thyristor body regions at a voltage threshold level that is less than a voltage threshold required for operating other circuitry in the semiconductor device.

13. The semiconductor device of claim 12, further comprising a pass transistor coupled in series with a first emitter region of the thyristor, wherein the pass transistor has a voltage threshold for switching between a current blocking state and a current passing state that is lower then a voltage threshold for forming the parasitic MOS-inversion channel.

14. The semiconductor device of claim 1, wherein the pass device has a gate, wherein the thyristor control port and the gate have different compositions.

15. The thyristor-based memory cell of claim 14, wherein the thyristor control port has a higher dopant concentration than the gate.

16. The semiconductor device of claim 1, wherein a first base region and a first emitter region form an cathode end of the thyristor, wherein a second base region and a second emitter region form an anode end of the thyristor, wherein the control port is configured and arranged to control current flow in the thyristor via primary capacitive coupling to the first base region.

17. The semiconductor device of claim 1, wherein the thyristor comprises a first base region and a first emitter region, the control port is configured and arranged to capacitively couple to the first base region and has a sidewall that is contiguously adjacent to a junction between the first base region and the first emitter region.

18. The semiconductor device of claim 1, further comprising an array of thyristors that includes said thyristor, the array being configured and arranged to store data for use in conjunction with the semiconductor device.

19. The semiconductor device of claim 1, wherein the thyristor is a thin capacitively-coupled thyristor.

20. A thyristor-based memory cell comprising:
 a plurality of thyristor regions including a first base region adjacent to a first emitter region and a second base region adjacent to a second emitter region, the first and second base regions being electrically coupled to one another;
 a pass device adapted to provide a voltage bias at one of the emitter regions and having a work function;
 means for capacitively coupling to the first base region for controlling current flow in the thyristor, said means being configured and arranged for inhibiting parasitic MOS-inversion channel formation in the thyristor regions while said means is controlling current flow in the thyristor, said means having a work function that is different than and defined independent of the work function of the pass device.

21. The thyristor-based memory cell of claim 20, wherein the pass device is coupled in series to the first emitter region, the pass device including first and second source/drain regions separated by a channel and a pass gate over the channel, the pass gate being configured and arranged to control current flow between the first and second source/drain regions, the first source/drain region being coupled to a bit line and the second source/drain region being coupled to the first emitter region, the thyristor-based memory cell being adapted to store and manipulate data in the first emitter region.

22. The thyristor-based memory cell of claim 21, wherein the first emitter region of the thyristor includes the second source/drain region of the pass device.

23. A memory cell comprising:
 a pass device having first and second source/drain regions separated by a channel region and a pass gate arranged to capacitively couple to the channel region via a gate dielectric material, the pass gate being configured and arranged to switch the channel region between a blocking state and a conducting state for current passing between the first and second source/drain regions in response to a voltage being applied to the pass gate;
 a bit line coupled to the first source/drain region;
 a first word line coupled to the pass gate;
 a thyristor comprising
  a plurality of thyristor regions including a first base region adjacent to a first emitter region and a second base region adjacent to a second emitter region, the first and second base regions being connected to one another and the first emitter region being connected to the second source drain region of the pass device, and a thyristor gate electrode configured and arranged to capacitively couple a signal to at least the first base region via a gate dielectric material and to switch the thyristor between a blocking state and a conducting state for passing current between the first and second emitter regions, the thyristor gate electrode exhibiting a gate workfunction that inhibits parasitic MOS-inversion channel formation in the thyristor when the thyristor gate electrode is controlled for controlling current passing and blocking in the plurality of thyristor regions; and a second word line coupled to the thyristor gate electrode and configured and arranged to apply a voltage to the thyristor gate electrode for capacitively coupling said signal.

* * * * *